United States Patent
Jang et al.

(10) Patent No.: US 6,806,205 B2
(45) Date of Patent: Oct. 19, 2004

(54) STICTION-FREE MICROSTRUCTURE RELEASING METHOD FOR FABRICATING MEMS DEVICE

(75) Inventors: Won-Ick Jang, Taejon (KR); Chang-Auck Choi, Taejon (KR); Chi-Hoon Jun, Taejon (KR); Youn-Tae Kim, Taejon (KR); Myung-Lae Lee, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/753,065

(22) Filed: Dec. 29, 2000

(65) Prior Publication Data

US 2002/0058422 A1 May 16, 2002

(30) Foreign Application Priority Data

Nov. 13, 2000 (KR) ........................................ 2000-67065

(51) Int. Cl.[7] .......................................... H01L 21/302
(52) U.S. Cl. ...................... 438/745; 438/747; 438/748; 438/756; 216/58
(58) Field of Search ................................ 438/745, 746, 438/747, 748, 756; 216/58, 79, 63, 73

(56) References Cited

U.S. PATENT DOCUMENTS

| | | | |
|---|---|---|---|
| 4,127,437 A | 11/1978 | Bersin et al. | |
| 4,749,440 A | 6/1988 | Blackwood et al. | |
| 5,294,568 A | * 3/1994 | McNeilly et al. | 438/706 |
| 5,439,553 A | * 8/1995 | Grant et al. | 216/58 |
| 5,772,902 A | * 6/1998 | Reed et al. | 216/2 |
| 6,126,847 A | * 10/2000 | Thakur et al. | 216/57 |
| 6,162,734 A | * 12/2000 | Bergman et al. | 438/706 |
| 6,238,580 B1 | * 5/2001 | Cole et al. | 216/2 |

OTHER PUBLICATIONS

Maboudian and Howe, "Critcal Review: Adhesion in Surface Micromechanical Structures, " J. Vac.Sci. Technol. B15(1),Jan./Feb. 1997, pp.1–20.
Gregory T. Mulhem et al., "Superfical Carbon Dioxide Drying of Microstructers," The 7–th INT. CONF. On Solid–State Sensors and Actuators, 1993, pp. 196–299.
Dai Kobayashi, et al., "An Intergrated Lateral Tunneling Unit, " Proc. IEEE Micro Electro Mechansical System, 1992, pp.214–219.
S.L.Luke Chang, et al., "Anhydrous HF etch reduces processing steps for DRAM capacitors, " Solid State Technology, May 1998, pp. 71–76.
H. Watanabe, et al., "Selective Etching of Phosphosilicate Glass with Low Pressure Vapor H, " J. Electrochem. Soc., Vol. 142, No. 1, Jan. 1995, The Electrochemical Society,.

* cited by examiner

*Primary Examiner*—Lan Vinh
(74) *Attorney, Agent, or Firm*—Blakely, Sokoloff, Taylor & Zafman (57) ABSTRACT

Disclosed is a a method of fabricating a MEMS device by means of surface micromachining without leaving any stiction or residues by etching silicon oxide of a sacrificial layer, which is an intermediate layer between a substrate and a microstructure, rather than by etching silicon oxide of a semiconductor device. The method according to the invention includes the steps of supplying alcohol vapor bubbled with anhydrous HF, maintaining a temperature of the supplying device and a moving path of the anhydrous HF and the alcohol to be higher than a boiling point of the alcohol, performing a vapor etching by controlling a temperature and a pressure to be within the vapor region of a phase equilibrium diagram of water, and removing silicon oxide of a sacrificial layer on a lower portion of the microstructure.

9 Claims, 8 Drawing Sheets

STICTION-FREE MICROSTRUCTURE RELEASING METHOD FOR FABRICATING MEMS DEVICE

FIELD OF THE INVENTION

The present invention relates to a stiction-free microstructure releasing method for fabricating a device of a microelectro-mechanical system (MEMS), and in particular, to a method of fabricating a MEMS device by means of surface micromachining without leaving any stiction or residues by etching silicon oxide of a sacrificial layer, which is an intermediate layer between a substrate and a microstructure, rather than by etching silicon oxide of a semiconductor device.

DESCRIPTION OF THE PRIOR ART

When using silicon oxide as a sacrificial layer and using a silicon as a microstructure, an HF solution is generally used for wet etching to remove the silicon oxide. A cleansing solution such as de-ionized (DI) water, methanol or isopropyl alcohol is used to rinse and remove the remaining HF solution.

However, using this method poses a problem of leaving the cleansing solution in a gap of a micron unit between the microstructure and the substrate in the drying process for evaporating the cleansing solution. A capillary force is generated by a surface tension due to the residue. If the capillary force becomes greater than the retrieving force, the microstructure tentatively sticks on the substrate. Such a tentative sticking is changed into a permanent surface sticking due to the van der Waals force, electrostatic force or hydrogen bridging. Such a phenomenon is referred to as a stiction.

Figure 1:
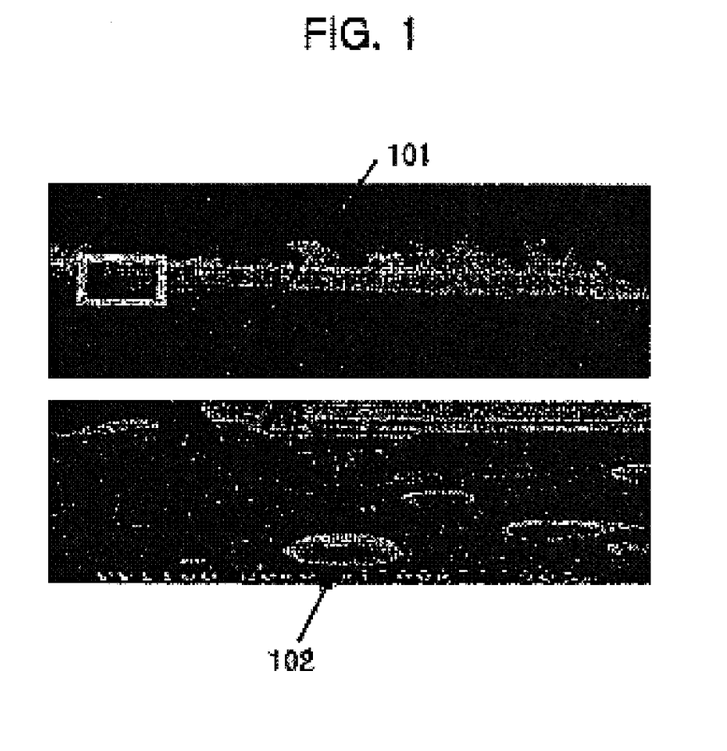
FIG. 1 is a photograph of a cross-sectional view showing stiction and residues generating in the course of fabricating a microstructure according to the conventional art.

Further, a reaction between the HF gas and methanol or isopropyl alcohol results in $H_2O$ due to a chemical reaction. At that time, the silicon oxide undergoing a removal process meets evaporating water drops, thereby leaving diverse kinds of residues that are not evaporated on the substrate due to condensation. FIG. 1 shows a photograph of such stiction and generation of residues.

Figure 5:
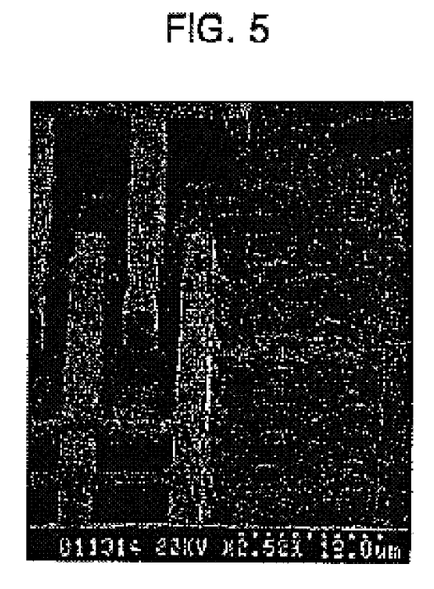
FIG. 5 is an SEM photograph showing stiction and residues generated by condensation in the course of fabricating a microstructure according to the conventional art.

FIG. 5 shows an SEM photograph of a vapor etching process. Stiction occurs and residues remain on the incompletely etched silicon oxide, which is a sacrificial layer, due to the scum, side wall polymerization and decorations of HF remaining on the etched silicon oxide.

To avoid such stiction and residues, researches have been conducted in diverse aspects. The methods presented at the initial stage of the research were reducing the contacting surface of the silicon by roughing and widening the surface area thereof, or undergoing an $NH_4F$ process for the silicon so as to be hydrophobic. However, these methods failed to release the microstructure on a revivable basis. The methods suggested recent days were a supercritical $CO_2$ drying method (the path A→B in FIG. 2) utilizing the characteristics of a phase transfer to a supercritical fluid by lowering the pressure after moving the cleansing solution to a supercritical region and converting the cleansing solution to a fluid, which is an intermediate state between gas and liquid, and a sublimation method of directly solidifying the cleansing solution by using sublime materials such as t-butyl alcohol, p-DCB (dicholorobenzene), etc. (the path A→C in FIG. 2) without undergoing a liquid state. However, these methods also pose a problem of failing to completely removing the water, failing to release the silicon microstructure on a revivable basis, or being complicated in its process while being very difficult in handling the testing pieces, thereby being uneconomical and inappropriate for massive production.

Accordingly, a demand has been raised to develop a method for effectively and revivably releasing the microstructure with a simple drying process of not resulting in stiction or generation of residues.

SUMMARY OF THE INVENTION

It is, therefore, an object of the present invention to provide a new method of releasing a microstructure on a completely separate basis without resulting in stiction or leaving residues by using anhydrous HF gas and alcohol vapor as well as by using a thermodynamic nature of water against temperature and pressure for etching silicon oxide of a sacrificial layer.

To achieve the above and other objects, there is provided a microstructure releasing method for fabricating a MEMS device according to the present invention comprising the steps of: supplying an alcohol vapor bubbled with anhydrous HF; maintaining a temperature of the supplying device and the moving path to be higher than a boiling point of the alcohol; vapor etching by controlling the temperature and pressure to be in a vapor region of a phase equilibrium diagram; and removing silicon oxide of a sacrificial layer on a lower portion of a microstructure.

The pressure for etching is preferably 25–75 torr with the temperature ranged 25–80° C. A process that may be performed before the etching is a vapor etching of a part of the silicon oxide. The silicon oxide of a sacrificial layer is preferably one or more components selected from the group consisting of TEOS, LTD, PSG, BPSG and a thermal silicon oxide, while the alcohol is preferably one or more components selected from the group consisting of methanol, isopropyl alcohol and ethanol. The MEMS device may be of a laminated structure or a single crystal structure.

To achieve the above and other objects, there is also provided a method for removing silicon oxide of a sacrificial layer for a microstructure, characterized by removing the silicon oxide of a sacrificial layer by means of a vapor etching with anhydrous HF and alcohol and by controlling the temperature and pressure of an etch chamber to be in a vapor region of a phase equilibrium diagram of water.

According to the method for removing the silicon oxide of a sacrificial layer for the microstructure of a MEMS device, the pressure in the etch chamber is preferably 25–75 torr with the temperature ranged 25–80° C. The pressure below 25 torr or the temperature higher than 80° C. delays or disables the etching. On the other hand, the pressure above 75 torr of the temperature lower than 25° C. undesirably accelerates the condensation process.

BRIEF DESCRIPTION OF THE DRAWINGS

The above and other objects, features and advantages of the present invention will become more apparent from the following detailed description when taken in conjunction with the accompanying drawings, in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 3:
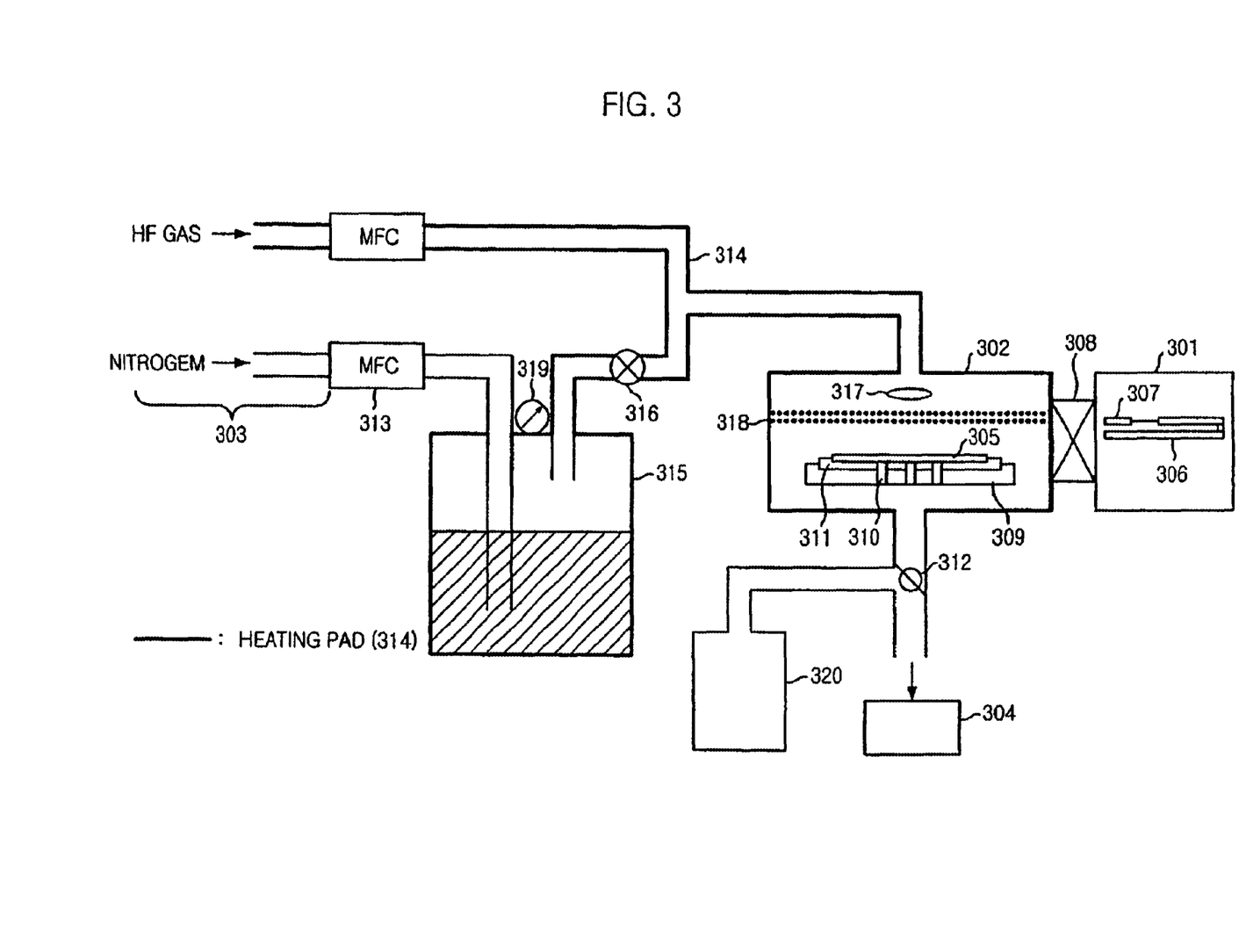
FIG. 3 is a cross-sectional view of a vapor etching device used according to an embodiment of the present invention.

FIG. 3 is a cross-sectional view of a vapor etching device used according to an embodiment of the present invention. The vapor etching device used according to the present invention comprises a load lock chamber 301, an etching chamber 302, a gas delivery system 303, a vacuum pump 304, and a control system. One of the characteristic features of the vapor etching device lies in that the temperature is maintained to be 100° C. not only in the gas cylinder, which is an HF delivery device, but also in the moving path toward the etching chamber as well as from an alcohol bubbler 315 to the etching chamber 302, thereby enabling the alcohol to arrive at the etching chamber 302 without being condensed after being vaporized by nitrogen. Under the temperature below the boiling point of alcohol (e.g., methanol 64.6° C.; isopropyl alcohol 82.7° C.), HF gas or the alcohol vapor fails to arrive at the etching chamber 302 but partially condensed on an inner wall of a gas line or an absolute liquid column is formed along the inner wall of the gas line later, thereby failing to precisely control the amount of liquid. Therefore, maintaining the temperature to be 100° C. is to prevent such phenomenon. Another characteristic feature of the present invention lies in that the etching chamber is also heated by a thermal heater so as not to condense the water generated in the reacting process. Another characteristic feature of the present invention lies in that inside of the etching chamber 302 and an exhaust pipe of the device according to the present invention is Teflon-coated so as not to be corroded by the HF gas.

Figure 2:
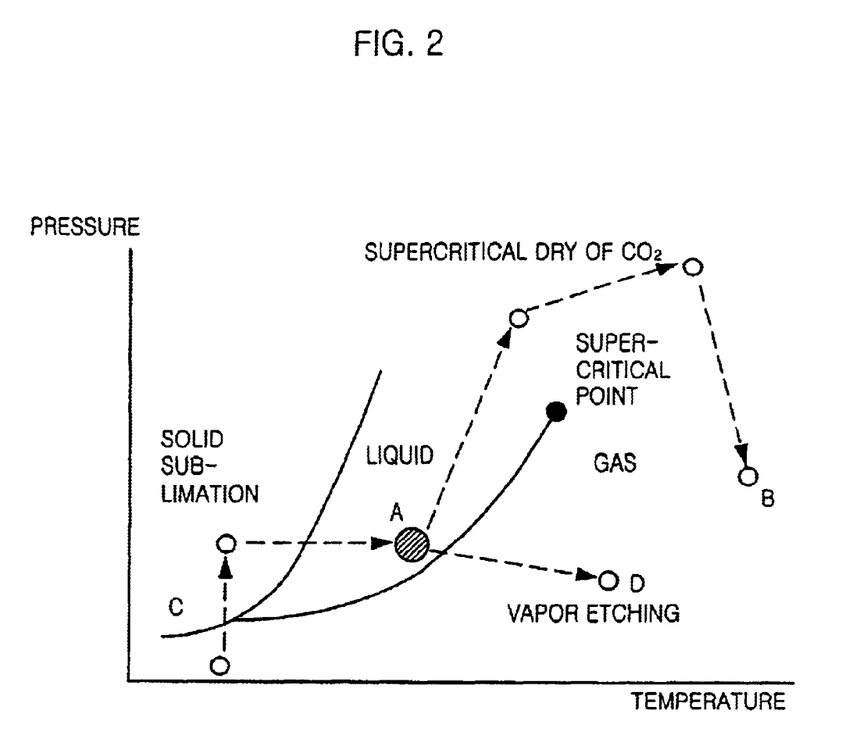
FIG. 2 is a phase equilibrium diagram of ordinary water.

A part of the considerable amount of water generated in the reacting process by the device according to the present invention is vaporized by a reaction with the alcohol, while the remaining water is completely vaporized without being condensed on the substrate by heating the entire etching chamber and raising the temperature of the substrate. Thus, it becomes possible to fabricate a microstructure completely separated and released without stiction or residues through the path A→D in FIG. 2 showing a phase equilibrium of water.

The following is a detailed description of a method for releasing a microstructure for fabricating a MEMS device.

Nitrogen is put into the etching chamber 302 when inputting and outputting a wafer 305 to make the etching chamber under an atmospheric pressure. The wafer 305 is put on a robotic arm 307 attached to an LM guide 306 in a load lock chamber 301 so as to be delivered to the etching chamber 302 through a gate valve 308. The 3-pins lifter 310 lifts up the wafer 305, and takes out the robotic arm 307. At the same time, the 3-pins lifter 310 moves down to lay the wafer 305 on a substrate 309 mounted on a heater 311. The etching chamber is emptied to be in a vacuum state by means of a vacuum pump. If the substrate 309 reaches a processing temperature by means of a throttle value 312, the processing gases are put into the etching chamber 302. For the etching of the silicon oxide, anhydrous HF supplied by an automatic mass flow controller 313 and alcohol vapor generated by injecting carrier gas into an alcohol bubbler 315. The anhydrous HF is surrounded by a heating pad 314 to supply gas under a steady pressure of 10 psi from a gas cylinder maintaining a steady temperature.

The inactive gas, which is the carrier gas, is put into the alcohol bubbler 315 by controlling the mass flow and velocity as desired by means of the automatic mass flow controller 313. The vaporized alcohol then becomes to maintain a desired pressure by means of a needle value 316 for pressure control, and is injected into a baffle 317 simultaneously with the HF. The vaporized alcohol is then supplied to the etching chamber 302 through a shower head 318 for evenly supplying injection gas. At this stage, change of the supplying amount of alcohol in the course of processing due to a change of the bubbler critically affects the etching rate of the silicon oxide, thereby changing the partial pressure of the HF. The change of the entire pressure of the alcohol bubbler means the following. Assuming that the partial pressure of the alcohol is steady as a saturated pressure, the pressure of the bubbler is a summing up of the partial pressures of the nitrogen and the alcohol. Thus, the partial pressure of the nitrogen is changed. Thus, the partial pressures of the HF, alcohol and the nitrogen become changed when the entire processing pressure is the same. Accordingly, the partial pressure of the HF critically affecting the etching rate of the sacrificial layer is changed, thereby changing the etching rate of the sacrificial layer because the etching rate is in proportion to a square of the partial pressure of the HP as well as to a product of the partial pressure of the alcohol.

The following is a chemical reaction formula representing the etching process of the silicon oxide.

As shown in the reaction formula (1), the HF and the alcohol adsorbed onto the substrate of the silicon oxide are ionized to be $HF_2^-$. Thus, the HF and the alcohol are the most significant etching reaction factors as in the wet etching of the adsorbed $HF_2$. $H_2SiF_6$ is generated as another by-product in the etching process, as shown in the reaction formula (2). As shown in the reaction formula (3), the $H_2SiF_6$ should be resolved into $SiF_4$ and the HF so as to be vaporized like water or alcohol without leaving any residues on the substrate. Also, it is preferable either to lower the content of water by increasing the partial pressure of the anhydrous HF or to raise the temperature of the wafer in order to suppress generation of residues. The etching rate of the silicon oxide in the reaction formula mainly depends on the partial pressure of the anhydrous HF and the alcohol adsorbed onto the substrate. The partial pressure controls the ionization reaction between the two species.

Figure 4:
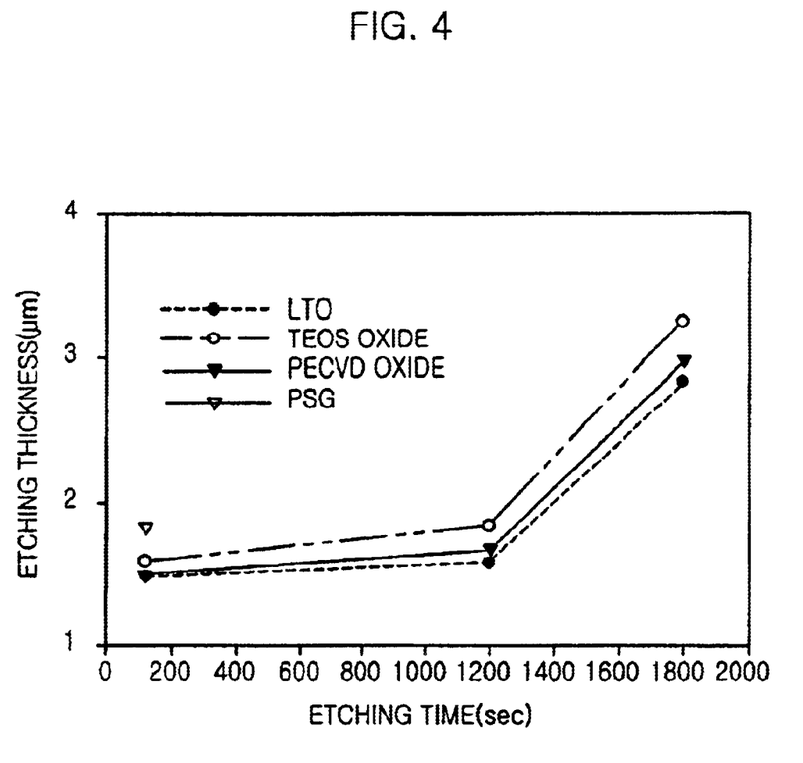
FIG. 4 is a graph showing etching velocities according to the kinds of silicon oxide of a sacrificial layer.

FIG. 4 shows etching rates of diverse kinds of silicon oxide of a sacrificial layer, i.e., low temperature oxide (LTO), tetraethylorthosilicate (TEOS) silicon oxide, PECVD oxide and phosphsilicate glass (PSG), according to the period of vapor etching time under the pressure of 50 torr and the temperature of 25° C. when the anhydrous HF and the isopropyl alcohol are used. It is shown in FIG. 4 that the PSG has the highest etching rate because of more adsorption of the reactant species thereon than any other kinds of silicon oxide.

The following are the detailed description of preferred embodiments of the present invention made with reference to the accompanying drawings.

Embodiment 1

A process was proceeded with by maintaining the pressure to be 50 torr and the temperature to be 35° C. by using the device shown in FIG. 3.

Atmospheric pressure is first created by putting nitrogen into the etching chamber 302. The wafer 305 is put into the etching chamber 302 through a gate valve 308, and laid on the substrate 309 mounted on the heater 311 inside of the etching chamber 302. The etching chamber 302 is emptied to be in a vacuum state by means of the vacuum pump 304. Once the temperature of the substrate 309 reaches 35° C. and the pressure inside of the etching chamber reaches 50 torr, alcohol vapor generated by injecting anhydrous HF and nitrogen, which is a carrier gas, into the bubbler 315 are put into the etching chamber 302. The anhydrous HF surrounded by the heating pad 314 supplies gas to the gas cylinder where the temperature is maintained to be 40° C. under the pressure of 10 psi. The nitrogen is controlled to be 1,000 sccm by the automatic mass flow controller 313, and put into the isopropyl alcohol babbler 315. The vaporized isopropyl alcohol is maintained to have a steady pressure of 10 psi by means of the needle value 316 for pressure control, and supplied to the etching chamber through an injection with the shower head 318 simultaneously with the HF.

The water vaporized under the temperature higher than 40° C. and the alcohol has a vapor pressure higher than the processing pressure under the temperature higher than 10° C. under the pressure stated above. Therefore, the alcohol is first vaporized than the water under the same temperature. The processing temperature was therefore selected to be 35° C. so as not to decrease the etching rate of the silicon oxide of the sacrificial layer by not raising the temperature of the substrate. Also, the heater surrounding the entire etching chamber is maintained to have a temperature of 100° C. so as to discharge the gas under a vaporized state without condensing the water generated during the processing by maintaining the temperature inside of the etching chamber to be higher than that of the substrate.

Figure 6:
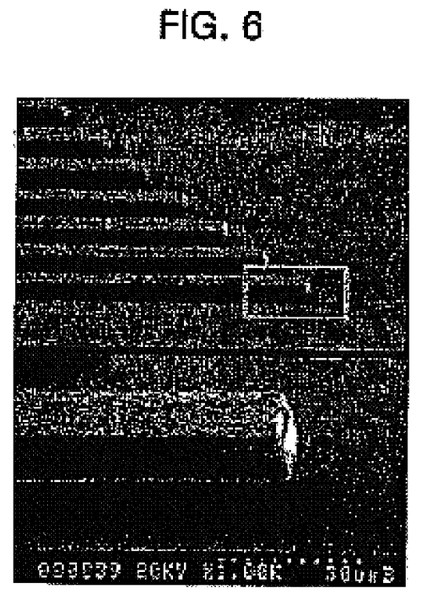
FIG. 6 is a photograph showing a cantilever released without stiction or residues according to the present invention.

FIG. 6 shows a result of the processing, i.e., a fabrication of a microstructure having a length of 1200 $\mu$m of a cantilever type.

Figure 7:
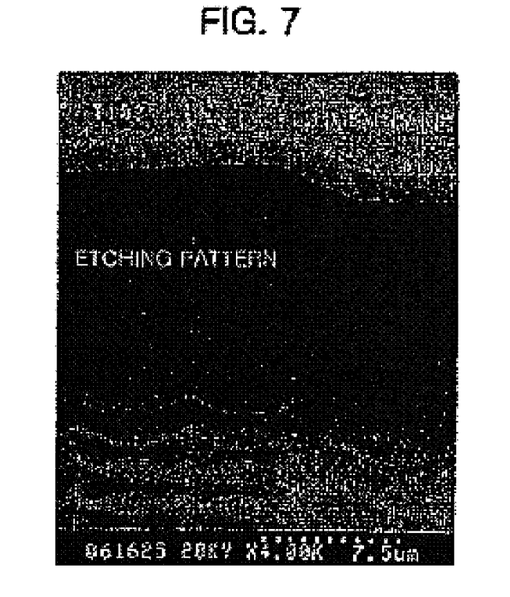
FIG. 7 is a photograph showing silicon oxide pattern being etched on a lower portion of a membrane according to the present invention.

FIG. 7 shows a process of removing the LTO sacrificial layer having a thickness of 4 $\mu$m through a hole having a diameter of 1 $\mu$m ranged at intervals of 5 $\mu$m on a sealed polycrystal silicon membrane having a thickness of 1.7 $\mu$m under the same conditions.

Embodiment 2

Figure 8:
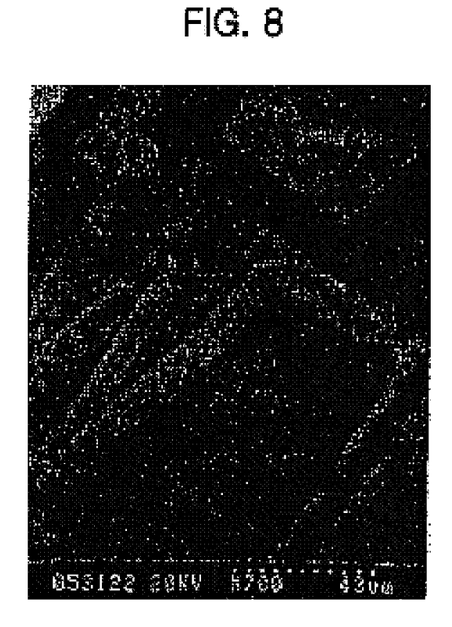
FIG. 8 is a photograph showing a spring released without stiction or residues, according to the present invention.

FIG. 8 is an SEM photograph showing a result of processing performed under the same conditions as in the Embodiment 1. A spring was perfectly released by means of a polycrystal silicon having a thickness of 12 $\mu$m.

Embodiment 3

Figure 9:
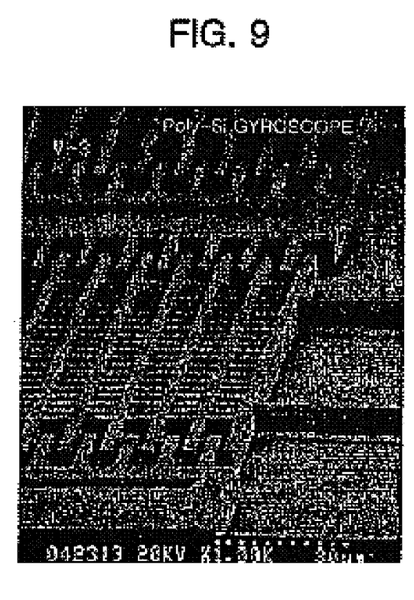
FIG. 9 is a photograph showing a multi-crystal silicon gyroscope fabricated according to the present invention.

FIG. 9 is an SEM photograph showing a result of processing performed under the same conditions as in the Embodiment 1. A gyroscope composed of the polycrystal silicon having a thickness of 8.6 $\mu$m was released.

Embodiment 4

Processing was performed under the same conditions as the Embodiment 1 except lowering the pressure below 25 torr. The same result was obtained as in the Embodiments 1 through 3.

Embodiment 5

Figure 10:
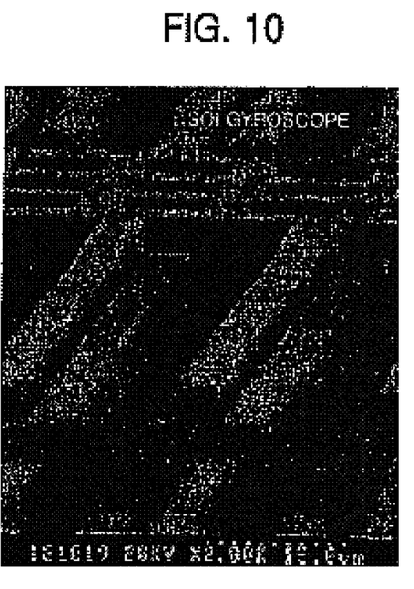
FIG. 10 is a photograph showing an SOI type gyroscope fabricated according to the present invention.

Vapor etching was performed by the same method as in the Embodiment 1 after performing the wet etching on the thermal silicon oxide, which is a sacrificial layer of the gyroscope using an SOI wafer. Of the diverse kinds of silicon oxide of a sacrificial layer, the thermal silicon oxide has a denser film quality than the existing TEOS silicon oxide. Thus, vapor etching was performed after performing the wet etching as thick as required. As a result, gyroscope composed of a silicon of an SOI structure having a thickness of 8 $\mu$m was released without any stiction. FIG. 10 is an SEM photograph showing the result.

Figure 11:
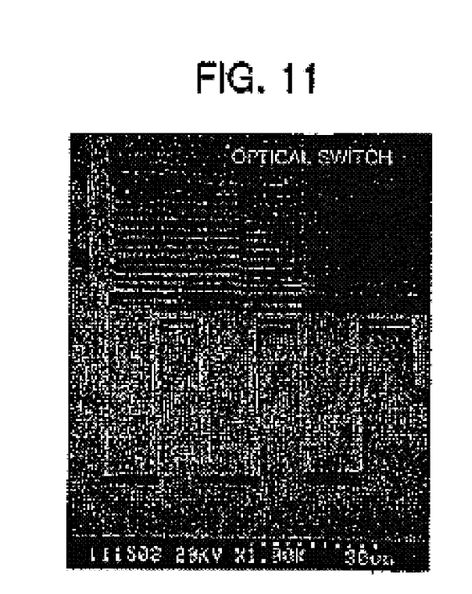
FIG. 11 is a photograph showing an optical switch fabricated according to the present invention.
Figure 12:
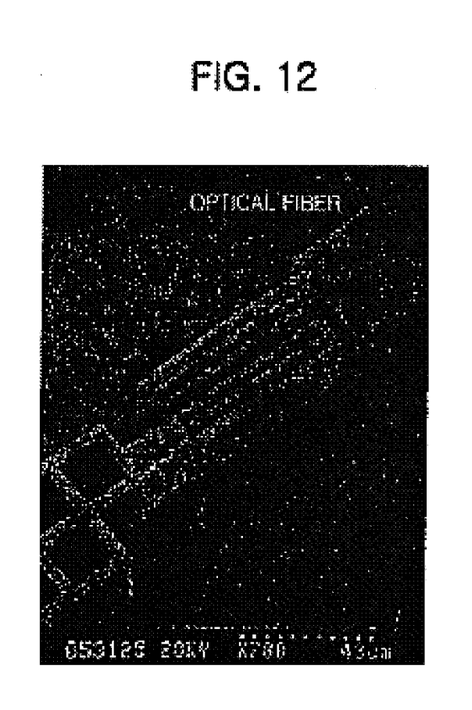
FIG. 12 is a photograph showing an optical filter fabricated according to the present invention.

Apart from the Embodiments exemplified above, diverse kinds of microstructure for fabricating a MEMS device such as an optical switch in FIG. 11 or an optical filter in FIG. 12 were successfully released without any stiction or residues.

Comparative Embodiment 1

An experiment was performed under the same conditions as the Embodiment 1 except creating the pressure of the liquid region (A) to be 50 torr and the temperature to be 25° C. A close look at the surface of the specimen with bare eyes found a regular distribution of traces of drying water having the same diameter. The traces are seem to have been left as a result of partial vaporization of water, which has been generated by a chemical reaction of the HF with the alcohol between the shower head 317 portion of the gas passing piper and dropped onto the surface of the specimen.

Comparative Embodiment 2

An experiment was performed by increasing the pressure up to 75 torr under the same conditions as the Comparative Embodiment 1. More traces of water were comprehensively left on the specimen.

This comparative embodiment confirmed that it is very effective to perform the processing within the vapor phase region of water by either lowering the pressure in the phase equilibrium diagram or raising the temperature so as to remove the water generated during the processing, as a remedy to prevent stiction of the microstructure or residues.

The etching rate may be lowered or enhanced by either controlling the partial pressure of the anhydrous HF or varying the kinds and partial pressures of the alcohol.

As described above, the present invention realized releasing a microstructure for fabricating a MEMS device by removing diverse kinds of silicon oxide of a sacrificial layer placed under the structure of monocrystal or polycrystal silicon with a vapor etching method using anhydrous HF and alcohol according to the present invention. The present invention also realized lowering or enhancing the etching rate by either controlling the partial pressure of the anhydrous HF or varying the kinds and partial pressures of the alcohol. Thus, the present invention provides a wider scope of applicability to fabrication of a MEMS device and a simple fabricating process as well as a revivability in releasing a microstructure. The present invention further has an economic merit of massive production as in case of a semiconductor device.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for releasing a microstructure for fabricating a device of a micro electro mechanical system (MEMS), comprising:

supplying bubbled alcohol vapor as a catalyst with anhydrous HF;

maintaining a temperature of the supplying device and a moving path of the anhydrous HF and the alcohol to be higher than a boiling point of the alcohol;

performing a vapor etching by controlling a temperature and a pressure to be within the vapor region of a phase equilibrium diagram of water, thereby removing silicon oxide of a sacrificial layer on a lower portion of the microstructure, wherein the vapor etching is performed under a total pressure of an etching chamber ranged from about 25 torr to about 75 torr and a temperature of a substrate ranged from about 25° C. to about 75° C., and a temperature inside of the etching chamber is maintained to be higher than that of the substrate so as to discharge the water generated during the vapor etching without condensation.

2. The method of claim 1, wherein anhydrous HF partial pressure is 2–50 torr, and alcoholic vapor partial pressure is 0.1–10 torr.

3. The method of claim 1, wherein an etching chamber temperature ranges 25–80° C. so as to discharge the gas without condensing the water.

4. The method of claim 1, wherein a step of performing a wet etching of a part of the silicon oxide precedes the step of performing the vapor etching.

5. The method of claim 1, wherein the silicon oxide of a sacrificial layer is any one component selected from the group consisting of TEOS, LTO, PSG, BPSG and a thermal silicon oxide.

6. The method of claim 1, wherein the alcohol is any one component selected from the group consisting of methanol, isopropyl alcohol and ethanol.

7. The method of claim 1, wherein the MEMS device has a laminated layer structure or a monocrystal silicon structure.

8. A method for removing silicon oxide of a sacrificial layer for a microstructure in a MEMS device, comprising:

removing the silicon oxide of a sacrificial layer by performing a vapor etching using anhydrous HF and alcohol by controlling a temperature and a pressure inside of an etching chamber to be within the region of a vapor of a phase equilibrium diagram of water, wherein the vapor etching is performed under a total pressure of an etching chamber ranged from about 25 torr to about 75 torr and a temperature of a substrate ranged from about 25° C. to about 75° C., and a temperature inside of the etching chamber is maintained to be higher than that of the substrate so as to discharge the water generated during the vapor etching without condensation.

9. The method of claim 8, wherein the temperature inside of the etching chamber is ranged to be 25–80° C.

* * * * *